US005789768A

United States Patent [19]
Lee et al.

[11] Patent Number: 5,789,768
[45] Date of Patent: Aug. 4, 1998

[54] LIGHT EMITTING DIODE HAVING TRANSPARENT CONDUCTIVE OXIDE FORMED ON THE CONTACT LAYER

[75] Inventors: Biing-Jye Lee; Ming-Jiunn Jou; Jacob C. Tarn, all of Hsinchu, Taiwan

[73] Assignee: Epistar Corporation, Hsinchu, Taiwan

[21] Appl. No.: 880,590

[22] Filed: Jun. 23, 1997

[51] Int. Cl.$^6$ .................................................. H01L 33/00
[52] U.S. Cl. .............................. 257/96; 257/98; 257/99; 257/103; 257/14
[58] Field of Search .................................. 257/14, 22, 94, 257/96, 98, 99, 103

[56] References Cited

U.S. PATENT DOCUMENTS 5,717,226  2/1998  Lee et al. ................................. 257/94

*Primary Examiner*—Minh-Loan Tran
*Attorney, Agent, or Firm*—Conley, Rose & Tayon, P.C.

[57] ABSTRACT

A structure of a light emitting diode (LED) having high brightness is disclosed. This LED includes a substrate formed on a first electrode, a first cladding layer of a first conductivity type formed on the substrate, an active layer formed on the first cladding layer, a second cladding layer of a second conductivity type formed on the active layer, a window layer of the second conductivity type formed on the second cladding layer, wherein the electrical resistivity of the window layer is less than the electrical resistivity of the second cladding layer, a contact layer of the second conductivity type formed on the window layer for providing ohmic contact, a conductive transparent oxide layer formed on the contact layer, and a current blocking region formed in the LED. The current blocking region is approximately aligned with a second electrode, and can be the contact layer having a hollow portion therein, an insulating region formed on the contact layer, an ion implanted region in the contact layer and the window layer, or a diffused region in the contact layer and the window layer.

47 Claims, 6 Drawing Sheets

LIGHT EMITTING DIODE HAVING TRANSPARENT CONDUCTIVE OXIDE FORMED ON THE CONTACT LAYER

BACKGROUND OF THE INVENTION

1. Field of the Invention

The present invention relates to the structure of a light emitting diode (LED), and more particularly to the structure of a surface emitting LED with a current blocking layer.

2. Description of the Prior Art

AlGaInP alloy technology has been used for making light emitting diodes (LEDs) of wavelength ranging from about 550 to 680 nanometers by adjusting the aluminum to gallium ratio in the active region of the LEDs. Further, metalorganic vapor phase epitaxy (MOVPE) is used to grow efficient AlGaInP heterostructure devices. A conventional LED contains a double heterostructure of AlGaInP, which includes an n-type AlGaInP cladding layer formed on an n-type semiconductor substrate of GaAs, an active layer of AlGaInP formed on the n-type cladding layer, and a p-type AlGaInP cladding layer formed on the active layer.

For efficient operation of the LED, injected current should be spread evenly in the lateral direction, so that the current will cross the p-n junction of the double heterostructure of AlGaInP uniformly to generate light evenly. The p-type AlGaInP cladding layer, which is grown by MOVPE process, is very difficult to dope with acceptors of a concentration higher than 1E18 $cm^{-3}$. Further, hole mobility (about 10 to 20 $cm^2 \text{*v/sec}$) is low in p-type AlGaInP semiconductor. Due to these factors, the electrical resistivity of the p-type AlGaInP layer is comparatively high (about 0.3–0.6 $\Omega$-cm normally), so that current spreading is severely restricted. Moreover, rise in aluminum of the composition of AlGaInP further increases the electrical resistivity. Consequently, current tends to concentrate, and is often referred to as a current crowding problem.

One technique to solve the current crowding problem is disclosed by Fletcher et. al. in U.S. Pat. No. 5,008,718. The structure of the proposed LED is shown in FIG. 1, and is fabricated with a back electrical contact 10, a semiconductor substrate of n-type GaAs 12, a double heterostructure of AlGaInP 14, a window layer of p-type GaP 16, and a front electrical contact 18. The double heterostructure of AlGaInP 14 mentioned above includes a bottom cladding layer of n-type AlGaInP 140, an active layer of AlGaInP 142, and a top cladding layer of p-type AlGaInP 144. The window layer 16 should be selected from materials that have a low electrical resistivity so that current can spread out quickly, and have a band gap higher than that of the AlGaInP layers so that the window layer 16 is transparent to light emitted from the active layer of AlGaInP 142.

In an LED for generating light in the spectrum from red to orange, AlGaAs material is selected to form the window layer 16. The AlGaAs material has the advantage of having a lattice constant compatible with that of the underlying GaAs substrate 12. In an LED for generating light in the spectrum from yellow to green, GaAsP or GaP material is used to form the window layer 16. It is a drawback of using the GaAsP or the GaP material that their lattice constants are not compatible with those of the AlGaInP layers 14 and the GaAs substrate 12. This lattice mismatch causes a high dislocation density that produces less than satisfactory optical performance. In Applied Physics Letter, vol. 61 (1992), p. 1045, K. H. Huang et. al. discloses a similar structure having a thick layer 16 of about 50 μm (or 500000 angstroms) in thickness. This structure provides a three-times illuminance efficiency than an LED without a window layer, and two-times illuminance efficiency than an LED with a window layer of about 10 μm in thickness. The fabrication of this structure unfavorably requires two different processes of metalorganic vapor phase epitaxy (MOVPE) for growing the double heterostructure of AlGaInP, and vapor phase epitaxy (VPE) for forming the thick window layer of GaP 16, thereby increasing manufacturing time and complexity.

FIG. 2 shows another prior art LED, which is disclosed in U.S. Pat. No. 5,048,035. In this figure, the layers that are not changed in appearance from the structure of FIG. 1 are labeled with the same reference numerals. The LED of FIG. 2, in addition to the structure of FIG. 1, is fabricated with a current-blocking layer of AlGaInP 20 on a portion of the double heterostructure 14, and a contact layer of GaAs 22 between the window layer 16 and the electrode 18. The current-blocking layer 20 is arranged at a position where it is in alignment with the front electrode 18 and thus current is spread out laterally by the current-blocking layer 20. Two MOVPE processes are disadvantageously required in fabricating this structure, i.e., forming the heterostructure 14 and the current-blocking layer 20 by a first MOVPE, followed by a photolithography technique to define the area of the current-blocking layer 20, and forming the window layer 16 by a second MOVPE.

FIG. 3 further shows a third prior art LED disclosed in U.S. Pat. No. 5,481,122. In this figure, the layers that are not changed in appearance from the structure of FIG. 1 are labeled with the same reference numerals. The window layer of GaP 16 in FIG. 1 is now replaced by a p-type contact layer 40 and a conductive transparent oxide layer 42 in FIG. 3. Indium tin oxide (ITO) is preferably used for forming the conductive transparent oxide layer 42, which has high transparency rate at about 90% in the range of visible light. Further, its electrical resistivity (about $3 \times 10^{-4}$ $\Omega$-cm) is about 1000 times smaller than that of p-type AlGaInP, and about 100 times smaller than that of p-type GaP. However, the optimal thickness of about 0.1–5 μm does not provide a good condition for effectively extracting side emission, thereby confining the illuminance efficiency of the LED.

FIG. 4 shows a fourth prior art LED. In this figure, the layers that are not changed in appearance from the structure of FIG. 3 are labeled with the same reference numerals. A Shottky barrier is formed as a current block between the electrode 19 and the top cladding layer of p-type AlGaInP 144 along with the conductive transparent oxide layer 42 to spread current laterally under the electrode 19. The disadvantage of forming this structure is the complex process required to etch portions of the conductive transparent oxide layer 42, the contact layer 40 and the top cladding layer 144.

SUMMARY OF THE INVENTION

The object of the present invention is to obtain high brightness and reduce manufacturing time for an LED having spectrum ranging from red to green by forming a current blocking layer, which is formed by a Shottky barrier, an insulating region, a highly resistive region, or a diffused p-n junction.

Another object of the present invention is to provide an LED, wherein most processes in forming the LED use only metalorganic vapor phase epitaxy (MOVPE), thereby achieving high controllability of composition, carrier concentration, layer thickness, and simplifying manufacturing.

A further object of the present invention is to provide an LED using multiple quantum well structure as an active layer to improve the quality of the crystalline and the illuminance efficiency of the LED.

Moreover, an object of the present invention is to provide an LED with a distributed Bragg reflector to eliminate the absorption of the light emitted from the active layer by the substrate, thereby increasing extraction efficiency of the LED.

In accordance with the present invention, a structure of LEDs is provided for obtaining high brightness. The LED includes a substrate formed on a first electrode. A first cladding layer of a first conductivity type is formed on the substrate, an active layer is formed on the first cladding layer, and a second cladding layer of a second conductivity type is formed on the active layer. The LED also includes a window layer of the second conductivity type formed on the second cladding layer, wherein the electrical resistivity of the window layer is less than the electrical resistivity of the second cladding layer, a contact layer of the second conductivity type formed on the window layer for providing ohmic contact, and a conductive transparent oxide layer formed on the contact layer. The LED further includes a current blocking region formed therein. The current blocking region can be the contact layer having a hollow portion therein, an insulating region formed on the contact layer, an ion implanted region in the contact layer and the window layer, or a diffused region in the contact layer and the window layer.

BRIEF DESCRIPTION OF THE DRAWINGS

The present invention can be fully understood by reading the subsequent detailed description of the preferred embodiments thereof with references made to the accompanying drawings, wherein.

DESCRIPTION OF THE PREFERRED EMBODIMENT

Figure 1:
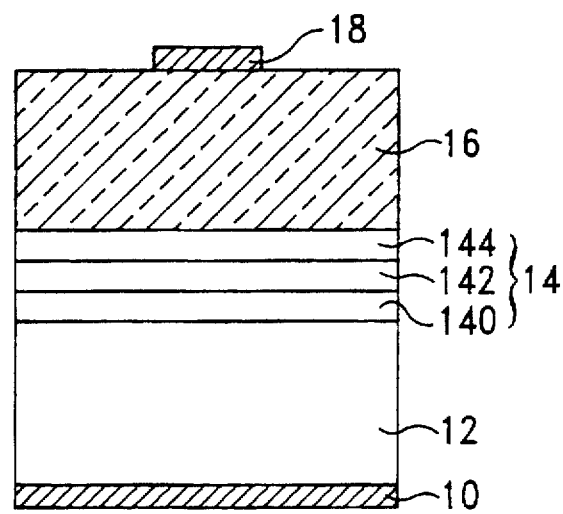
FIG. 1 shows a cross-sectional view of a first prior art LED.
Figure 2:
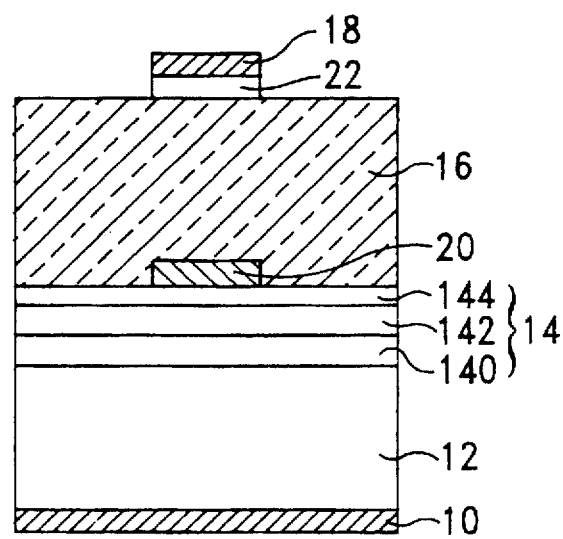
FIG. 2 shows a cross-sectional view of a second prior art LED.
Figure 3:
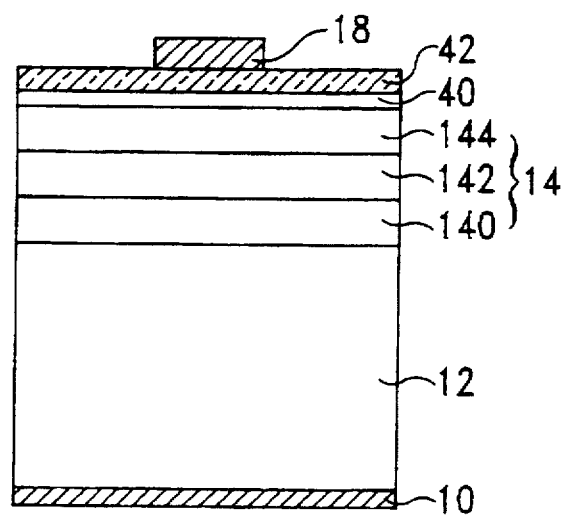
FIG. 3 shows a cross-sectional view of a third prior art LED.
Figure 4:
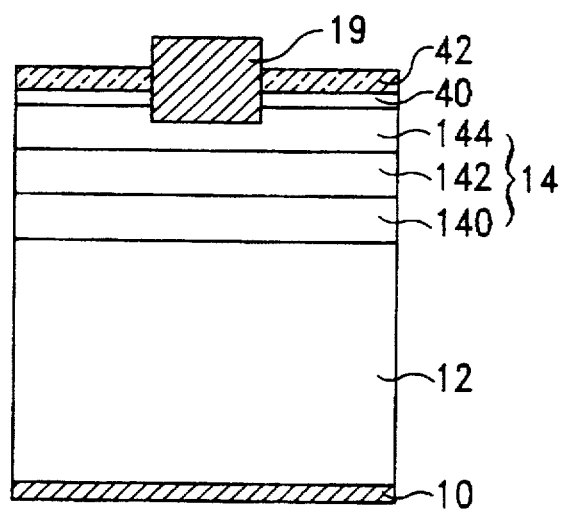
FIG. 4 shows a cross-sectional view of a fourth prior art LED.
Figure 5A:
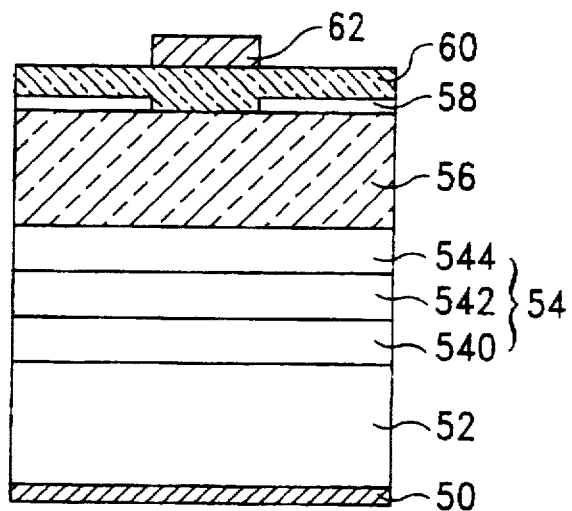
FIG. 5A shows a cross-sectional view illustrative of an LED in accordance with the first embodiment of the present invention.

FIG. 5A shows a cross-sectional view illustrative of a light emitting diode (LED) in accordance with the first embodiment of the present invention. A back electrical contact 50 is provided to act as a back electrode. An n-type electrode is used in this embodiment and, however, it is appreciated that p-type electrode can be used instead without departing from the scope of the claimed invention.

A semiconductor substrate 52 is then formed on the n-type electrode 50. In this embodiment, an n-type GaAs layer 52 is conventionally formed to a thickness of about 350 μm. A stacked structure of AlGaInP 54, which is often referred to as active p-n junction layer, is formed on the substrate 52. In this embodiment, the stacked structure 54 includes a bottom n-type cladding layer of AlGaInP 540, an active layer of AlGaInP 542, and a top p-type cladding layer of AlGaInP 544. The thickness of the bottom cladding layer 540, the active layer 542 and the top cladding layer 544 is preferably about 1.0, 0.75, and 1.0 μm respectively.

In one implementation of this embodiment, the active layer 542 is formed using a conventional double heterostructure (DH) technique. In another implementation, the active layer 542 is formed using another conventional multiple quantum well (MQW) technique. Owing to quantum effect, the proportion of Al in the active layer 542 decreases, therefore reducing proportion of oxygen therein. Consequently, the quality of the crystalline is improved, and the illuminance efficiency of the LED increases accordingly. Further, carrier overflow phenomenon is reduced because the carriers are effectively confined in the quantum wells as the number of the quantum wells becomes large.

Referring back to FIG. 5A, a p-type window layer 56 having a thickness of about 10 μm is formed on the top cladding layer 544. The electrical resistivity of the window layer 56 (about 0.05 Ω-cm) is less than or equal to that of the top cladding layer 544. Transparent material, such as GaP, GaAsP, GaInP or AlGaAs is preferably used. This window layer 56 is used to improve the illuminance efficiency of the LED. For example, a conventional 590 nm LED without a window layer usually has brightness of 15 minicandela (or mcd). However, 30 mcd or more can be obtained by adding the window layer 56 on the top cladding layer 544.

Referring to FIG. 5A again, a p-type contact layer 58 is formed on the window layer 56. GaAsP, GaP, GaInP, or GaAs is used to form this contact layer 58. In this embodiment, the carrier concentration is greater than $5\times10^{18}$ $cm^{-3}$, and its thickness is greater than 500 angstroms, so that a good ohmic contact can be formed between the window layer 56 and a conductive transparent oxide layer 60, which will be described later. The electrical resistivity of the conductive transparent oxide layer 60 (about $3\times10^{-4}$ Ω-cm) is smaller than that of the contact layer 58 (about 0.01 Ω-cm) and the window layer 56 (about 0.05 Ω-cm). Next, a conventional photolithography process is used to define a central area in the contact layer 58, which is then etched until a portion of the surface of the window layer 56 is exposed.

Tin oxide, indium oxide, or indium tin oxide (ITO) is preferably used to form the conductive transparent oxide layer 60. The preferred thickness of the conductive transparent oxide layer 60 is between 0.1 and 5 and In this embodiment, the conductive transparent oxide layer 60 is formed by a sputtering or E-beam evaporation method. Therefore, the transmittance of the conductive transparent oxide layer 60 is excellent for LEDs in the wavelength range from 550 nanometers (green) to 630 nanometers (red).

Because the conductive transparent oxide possesses a similar property to the metal, the conductive transparent oxide layer 60 and the window layer 56 can not form an ohmic contact through tunneling effect when the carrier concentration in the window layer 56 is less than $1 \times 10^{19}$ cm$^3$. The interface between the conductive transparent oxide layer 60 and the window layer 56 therefore results in a Shottky barrier, which then acts as a current block. It is found experimentally that the resistivity between the conductive transparent oxide layer 60 and contact layer 58 is about 10 ohm and the resistivity between the conductive transparent oxide layer 60 and the window layer 56 is $10^{13-1015}$ ohm. Therefore, the formed Shottky barrier has a good current blocking capability in a normal LED operating condition with the current under 100 mA. The conductive transparent oxide layer 60 does not absorb photons emitted from the active layer 542, and its electrical resistivity is only about $3 \times 10^{-4}$ Ω-cm, so that the injected current may substantially spread out through the entire diode except the region where the Schottky barrier exists, thereby contributing to higher power output.

Finally, a p-type electrical contact 62 is formed on a portion of the conductive transparent oxide layer 60 to act as a front electrode. This electrical contact 62 is approximately aligned with the etched hollow in the contact layer 58. It is noted that each layer, except the conductive transparent oxide layer 60 and the electrodes 50, 62, shown in FIG. 5A can be grown using metalorganic vapor phase epitaxy (MOVPE) method, thereby achieving high controllability of composition, carrier concentration, layer thickness, and simplifying manufacturing.

Figure 5B:
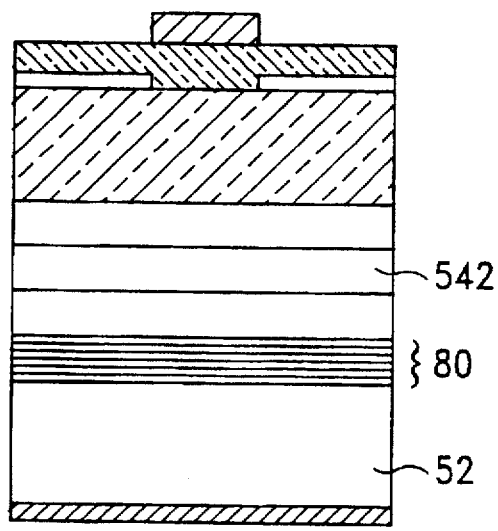
FIG. 5B shows a cross-sectional view illustrative of a modified LED in accordance with the first embodiment of the present invention.

FIG. 5B shows a cross-sectional view illustrative of a modified LED in accordance with the first embodiment of the present invention. The basic difference from the structure of FIG. 5A is the additive distributed Bragg reflector (DBR) layer 80. AlGaInP or AlGaAs is preferably used in forming this DBR layer 80, which includes a stack of more than 20 layers in this embodiment. The DBR layer 80 is primarily used to eliminate the absorption of the light emitted from the active layer 542 by the substrate 52, thereby increasing extraction efficiency of the LED. In this embodiment, 80~100 mcd can be obtained by using the DBR layer 80.

Figure 6A:
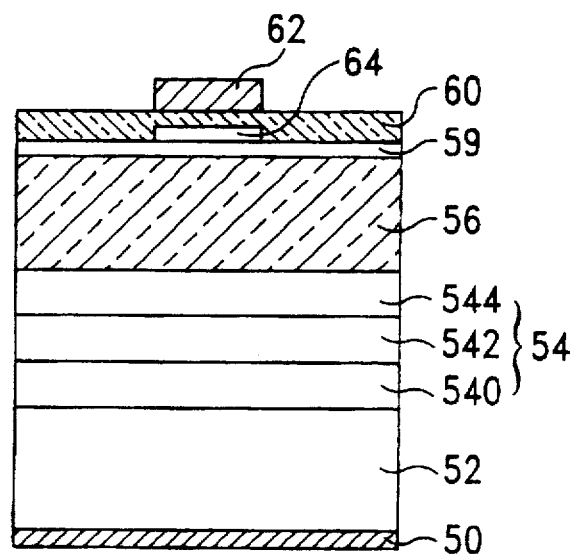
FIG. 6A shows a cross-sectional view illustrative of an LED in accordance with the second embodiment of the present invention.

FIG. 6A shows a cross-sectional view illustrative of an LED in accordance with the second embodiment of the present invention. In this figure, the layers that are not changed in appearance from the structure of FIG. 5A are labeled with the same reference numerals, and are formed by the same processes. The basic difference is that the contact layer 59 is not etched as in FIG. 5A, but instead an insulating layer 64 is formed on the surface of the contact layer 59. The insulating layer 64 is then partially etched by a conventional photolithography technique and an etch process, resulting in the structure as shown in FIG. 6A. The resultant insulating region 64 is aligned with the electrical contact 62. This insulating region 64 is used as a current blocking layer. In this embodiment, the insulating layer 64, such as silicon oxide, silicon nitride or aluminum oxide is formed by a conventional plasma enhanced chemical vapor deposition (PECVD) method to a thickness of about 0.1 μm.

Figure 6B:
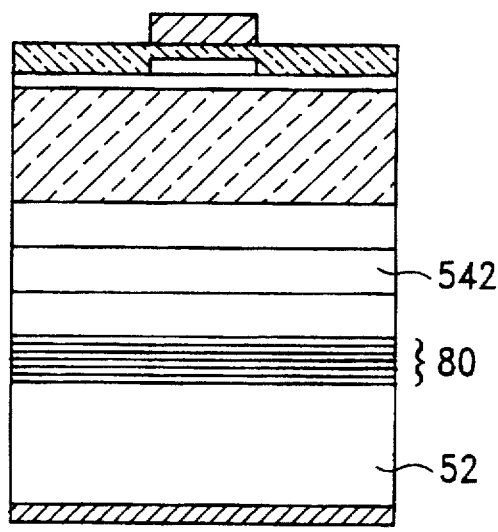
FIG. 6B shows a cross-sectional view illustrative of a modified LED in accordance with the second embodiment of the present invention.

FIG. 6B shows a cross-sectional view illustrative of a modified LED in accordance with the second embodiment of the present invention. In this figure, the layers that are not changed in appearance from the structure of FIGS. 5A and 5B are labeled with the same reference numerals, and are formed by the same processes. The basic difference from the structure of FIG. 6A is the additive distributed Bragg reflector (DBR) layer 80. AlGaInP or AlGaAs is preferably used in forming this DBR layer 80, which includes a stack of more than 20 layers in this embodiment. The DBR layer 80 is primarily used to eliminate the absorption of the light emitted from the active layer 542 by the substrate 52, thereby increasing extraction efficiency of the LED. In this embodiment, 80~100 mcd can be obtained by using the DBR layer 80.

Figure 7A:
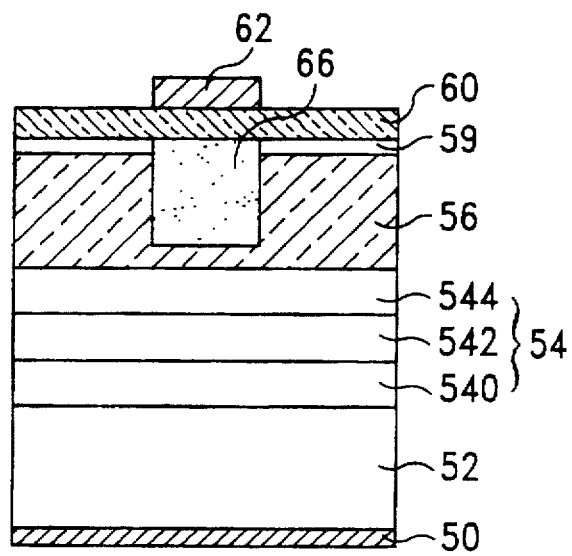
FIG. 7A shows a cross-sectional view illustrative of an LED in accordance with the third embodiment of the present invention.

FIG. 7A shows a cross-sectional view illustrative of an LED in accordance with the third embodiment of the present invention In this figure, the layers that are not changed in appearance from the structure of FIG. 6A are labeled with the same reference numerals, and are formed by the same processes. The basic difference is that there is no insulating layer formed on the contact layer 59, but instead a photolithography technique and an ion implantation are performed to form a highly resistive region 66 in the central portions of the contact layer 59 and the window layer 56 as shown in FIG. 7A. This resistive region 66 is approximately aligned with the electrical contact 62. In this embodiment, ions, such as H$^+$ or O$^+$, are implanted to form the region 66. This highly resistive region 66 is used as a current blocking layer.

Figure 7B:
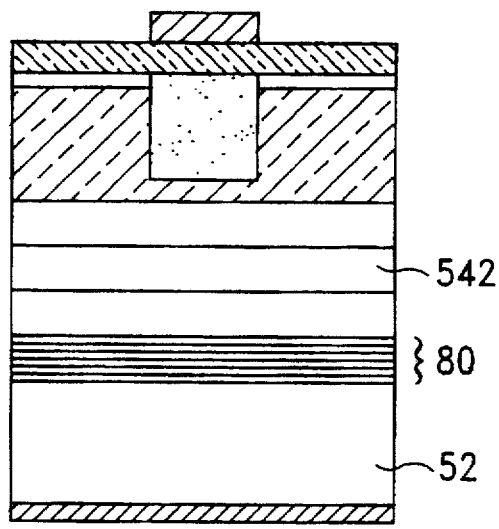
FIG. 7B shows a cross-sectional view illustrative of a modified LED in accordance with the third embodiment of the present invention.

FIG. 7B shows a cross-sectional view illustrative of a modified LED in accordance with the third embodiment of the present invention. In this figure, the layers that are not changed in appearance from the structure of FIGS. 6A and 6B are labeled with the same reference numerals, and are formed by the same processes. The basic difference from the structure of FIG. 7A is the additive distributed Bragg reflector (DBR) layer 80. AlGaInP or AlGaAs is preferably used in forming this DBR layer 80, which includes a stack of more than 20 layers in this embodiment. The DBR layer 80 is primarily used to eliminate the absorption of the light emitted from the active layer 542 by the substrate 52, thereby increasing extraction efficiency of the LED. In this embodiment, 80~100 mcd can be obtained by using the DBR layer 80.

Figure 8A:
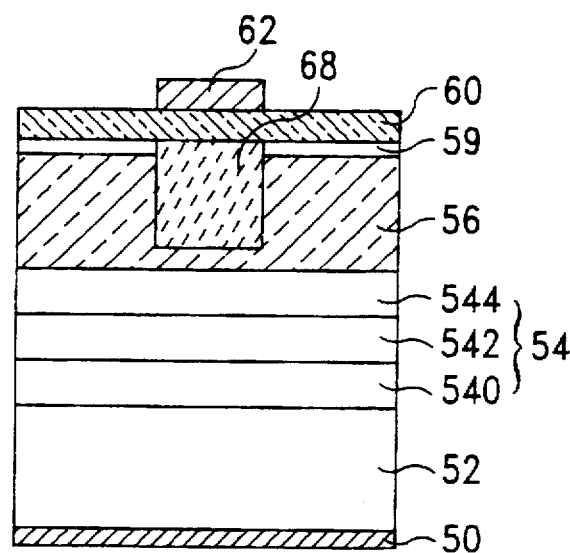
FIG. 8A shows a cross-sectional view illustrative of an LED in accordance with the fourth embodiment of the present invention.

FIG. 8A shows a cross-sectional view illustrative of an LED in accordance with the fourth embodiment of the present invention. In this figure, the layers that are not changed in appearance from the structure of FIG. 7A are labeled with the same reference numerals, and are formed by the same processes. The layers in FIG. 8A have different conductivity type from those layers in FIG. 7A. More specifically, in FIG. 8A, the electrode 50, the substrate 52, and the bottom cladding layer 540 are p type. However, the top cladding layer 544, the window layer 56, the contact layer 59, and the electrode layer 62 are n type. A photolithography technique and a diffusion method are performed to form a diffused area 68 in the central portions of the contact layer 59 and the window layer 56 as shown in FIG. 8A. This diffused area 68 is approximately aligned with the electrical contact 62. In this embodiment, p type atoms, such as Zn, are diffused to form the region 68. The diffusion depth depends on the thickness of the window layer 56. Preferably, the bottom surface of the diffused region 68 is more than 1 μm above the bottom surface of the window layer 56. The potential barrier of the p-n junction formed between the diffused region 68 and the window layer 56 is then used as a current block.

Figure 8B:
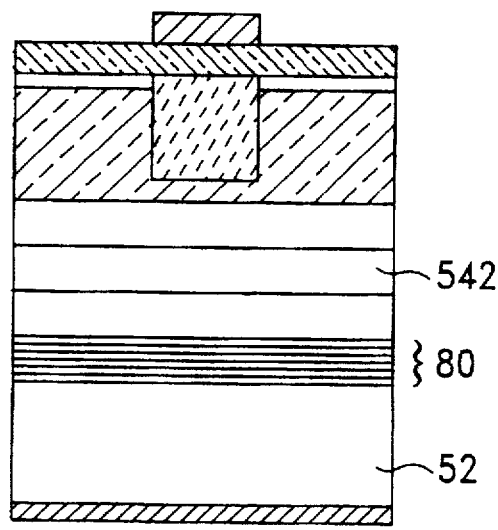
FIG. 8B shows a cross-sectional view illustrative of a modified LED in accordance with the fourth embodiment of the present invention.

FIG. 8B shows a cross-sectional view illustrative of a modified LED in accordance with the fourth embodiment of the present invention In this figure, the layers that are not changed in appearance from the structure of FIGS. 7A and 7B are labeled with the same reference numerals, and are formed by the same processes. The basic difference from the structure of FIG. 8A is the additive distributed Bragg reflector (DBR) layer 80. AlGaInP or AlGaAs is preferably used in forming this DBR layer 80, which includes a stack of more than 20 layers in this embodiment. The DBR layer 80 is primarily used to eliminate the absorption of the light emitted from the active layer 542 by the substrate 52, thereby increasing extraction efficiency of the LED. In this embodiment, 80–100 mcd can be obtained by using the DBR layer 80.

Although specific embodiments have been illustrated and described, it will be obvious to those skilled in the art that various modifications may be made without departing from the spirit which is intended to be limited solely by the appended claims.

What is claimed is:

1. A light emitting diode comprising:
   a substrate formed on a first electrode;
   a first cladding layer of a first conductivity type formed on said substrate;
   an active layer formed on said first cladding layer;
   a second cladding layer of a second conductivity type formed on said active layer;
   a window layer of the second conductivity type formed on said second cladding layer, electrical resistivity of said window layer being less than electrical resistivity of said second cladding layer;
   a contact layer of the second conductivity type formed on said window layer for providing ohmic contact, said contact layer having a hollow portion extending from the top surface of said contact layer to the bottom surface of said contact layer, thereby exposing said window layer;
   a conductive transparent oxide layer formed on said contact layer, and filled the hollow portion in said contact layer, electrical resistivity of said conductive transparent oxide layer being less than electrical resistivity of said window layer and said contact layer; and
   a second electrode formed on a portion of said conductive transparent oxide layer, said second electrode being approximately aligned with the hollow portion in said contact layer.

2. The light emitting diode according to claim 1, wherein said active layer comprises AlGaInP.

3. The light emitting diode according to claim 2, wherein said active layer comprises an AlGaInP multiple quantum well structure.

4. The light emitting diode according to claim 1, wherein said window layer comprises a material chosen from the group consisting of GaP, GaAsP, GaInP, and AlGaAs.

5. The light emitting diode according to claim 1, wherein said contact layer comprises a material chosen from the group consisting of GaAsP, GaP, GaInP, and GaAs.

6. The light emitting diode according to claim 1, wherein said conductive transparent oxide layer comprises a material chosen from the group consisting of indium tin oxide, indium oxide, tin oxide, zinc oxide, and magnesium oxide.

7. The light emitting diode according to claim 1, wherein said substrate comprises GaAs.

8. The light emitting diode according to claim 1, wherein said first cladding layer comprises AlGaInP.

9. The light emitting diode according to claim 1, wherein said second cladding layer comprises AlGaInP.

10. The light emitting diode according to claim 1, further comprising a distributed Bragg reflector layer of a first conductivity type having a plurality of sublayers formed on said substrate and under said first cladding layer.

11. The light emitting diode according to claim 10, wherein said distributed Bragg reflector layer comprises a material chosen from the group consisting of AlGaInP and AlGaAs.

12. A light emitting diode comprising:
    a substrate formed on a first electrode;
    a first cladding layer of a first conductivity type formed on said substrate;
    an active layer formed on said first cladding layer;
    a second cladding layer of a second conductivity type formed on said active layer;
    a window layer of the second conductivity type formed on said second cladding layer, electrical resistivity of said window layer being less than electrical resistivity of said second cladding layer;
    a contact layer of the second conductivity type formed on said window layer for providing ohmic contact;
    an insulating region formed on a portion of said contact layer;
    a conductive transparent oxide layer formed on said contact layer and said insulating region, electrical resistivity of said conductive transparent oxide layer being less than electrical resistivity of said window layer and said contact layer; and
    a second electrode formed on a portion of said conductive transparent oxide layer, said second electrode being approximately aligned with said insulating region.

13. The light emitting diode according to claim 12, wherein said active layer comprises AlGaInP.

14. The light emitting diode according to claim 13, wherein said active layer comprises an AlGaInP multiple quantum well structure.

15. The light emitting diode according to claim 12, wherein said window layer comprises a material chosen from the group consisting of GaP, GaAsP, GaInP, and AlGaAs.

16. The light emitting diode according to claim 12, wherein said contact layer comprises a material chosen from the group consisting of GaAsP, Gap, GaInP, and GaAs.

17. The light emitting diode according to claim 12, wherein said conductive transparent oxide layer comprises a material chosen from the group consisting of indium tin oxide, indium oxide, tin oxide, zinc oxide, and magnesium oxide.

18. The light emitting diode according to claim 12, wherein said substrate comprises GaAs.

19. The light emitting diode according to claim 12, wherein said first cladding layer comprises AlGaInP.

20. The light emitting diode according to claim 12, wherein said second cladding layer comprises AlGaInP.

21. The light emitting diode according to claim 12, further comprising a distributed Bragg reflector layer of a first conductivity type having a plurality of sublayers formed on said substrate and under said first cladding layer.

22. The light emitting diode according to claim 21, wherein said distributed Bragg reflector layer comprises a material chosen from the group consisting of AlGaInP and AlGaAs.

23. The light emitting diode according to claim 12, wherein said insulating region comprises a material chosen from the group consisting of silicon oxide, silicon nitride, and aluminum oxide.

24. A light emitting diode comprising:
    a substrate formed on a first electrode;
    a first cladding layer of a first conductivity type formed on said substrate;
    an active layer formed on said first cladding layer;
    a second cladding layer of a second conductivity type formed on said active layer;

a window layer of the second conductivity type formed on said second cladding layer, electrical resistivity of said window layer being less than electrical resistivity of said second cladding layer;

a contact layer of the second conductivity type formed on said window layer for providing ohmic contact, portions of said contact layer and said window layer being ion implanted to form a resistive region of the second conductivity type;

a conductive transparent oxide layer formed on said contact layer, electrical resistivity of said conductive transparent oxide layer being less than electrical resistivity of said window layer and said contact layer; and a second electrode formed on a portion of said conductive transparent oxide layer, said second electrode being approximately aligned with the resistive region in said contact layer and said window layer.

25. The light emitting diode according to claim 24, wherein said active layer comprises AlGaInP.

26. The light emitting diode according to claim 25, wherein said active layer comprises an AlGaInP multiple quantum well structure.

27. The light emitting diode according to claim 24, wherein said window layer comprises a material chosen from the group consisting of GaP, GaAsP, GaInP, and AlGaAs.

28. The light emitting diode according to claim 24, wherein said contact layer comprises a material chosen from the group consisting of GaAsP, GaP, GaInP, and GaAs.

29. The light emitting diode according to claim 24, wherein said conductive transparent oxide layer comprises a material chosen from the group consisting of indium tin oxide, indium oxide, tin oxide, zinc oxide, and magnesium oxide.

30. The light emitting diode according to claim 24, wherein said substrate comprises GaAs.

31. The light emitting diode according to claim 24, wherein said first cladding layer comprises AlGaInP.

32. The light emitting diode according to claim 24, wherein said second cladding layer comprises AlGaInP.

33. The light emitting diode according to claim 24, further comprising a distributed Bragg reflector layer of a first conductivity type having a plurality of sublayers formed on said substrate and under said first cladding layer.

34. The light emitting diode according to claim 33, wherein said distributed Bragg reflector layer comprises a material chosen from the group consisting of AlGaInP and AlGaAs.

35. The light emitting diode according to claim 24, wherein ions of said ion implantation are $H^+$ or $O^+$ ions.

36. A light emitting diode comprising:

a substrate formed on a first electrode;

a first cladding layer of a first conductivity type formed on said substrate;

an active layer formed on said first cladding layer;

a second cladding layer of a second conductivity type formed on said active layer;

a window layer of the second conductivity type formed on said second cladding layer, electrical resistivity of said window layer being less than electrical resistivity of said second cladding layer;

a contact layer of the second conductivity type formed on said window layer for providing ohmic contact, portions of said contact layer and said window layer being ion diffused to form a diffused region of the second conductivity type, thereby resulting in a potential barrier between said window layer and the diffused region;

a conductive transparent oxide layer formed on said contact layer, electrical resistivity of said conductive transparent oxide layer being less than electrical resistivity of said window layer and said contact layer; and a second electrode formed on a portion of said conductive transparent oxide layer, said second electrode being approximately aligned with the diffused region in said contact layer and said window layer.

37. The light emitting diode according to claim 36, wherein said active layer comprises AlGaInP.

38. The light emitting diode according to claim 37, wherein said active layer comprises an AlGaInP multiple quantum well structure.

39. The light emitting diode according to claim 36, wherein said window layer comprises a material chosen from the group consisting of GaP, GaAsP, GaInP, and AlGaAs.

40. The light emitting diode according to claim 36, wherein said contact layer comprises a material chosen from the group consisting of GaAsP, GaP, GaInP, and GaAs.

41. The light emitting diode according to claim 36, wherein said conductive transparent oxide layer comprises a material chosen from the group consisting of indium tin oxide, indium oxide, tin oxide, zinc oxide, and magnesium oxide.

42. The light emitting diode according to claim 36, wherein said substrate comprises GaAs.

43. The light emitting diode according to claim 36, wherein said first cladding layer comprises AlGaInP.

44. The light emitting diode according to claim 36, wherein said second cladding layer comprises AlGaInP.

45. The light emitting diode according to claim 36, further comprising a distributed Bragg reflector layer of a first conductivity type having a plurality of sublayers formed on said substrate and under said first cladding layer.

46. The light emitting diode according to claim 45, wherein said distributed Bragg reflector layer comprises a material chosen from the group consisting of AlGaInP and AlGaAs.

47. The light emitting diode according to claim 36, wherein ions of said diffusion are Zn ions.

* * * * *